United States Patent [19]

Davis

[11] Patent Number: 5,081,374
[45] Date of Patent: Jan. 14, 1992

[54] OUTPUT BUFFER CIRCUIT WITH SIGNAL FEED FORWARD FOR REDUCING SWITCHING INDUCED NOISE

[75] Inventor: Jeffrey B. Davis, Raymond, Me.

[73] Assignee: National Semiconductor Corporation, Santa Clara, Calif.

[21] Appl. No.: 483,927

[22] Filed: Feb. 22, 1990

[51] Int. Cl.$^5$ .......................... H03K 19/02; H03K 5/12
[52] U.S. Cl. ..................................... 307/451; 307/473; 307/263; 307/270; 307/542; 307/296.1
[58] Field of Search ............... 307/263, 443, 448, 451, 307/473, 270, 542, 296.4

[56] References Cited

U.S. PATENT DOCUMENTS

| | | | |
|---|---|---|---|
| 4,719,369 | 1/1988 | Asano et al. | 307/263 |
| 4,825,101 | 4/1989 | Walters, Jr. | 307/263 |
| 4,829,199 | 5/1989 | Prater | 307/443 |

Primary Examiner—Stanley D. Miller
Assistant Examiner—Margaret Rose Wambach
Attorney, Agent, or Firm—James W. Rose; Daniel H. Kane

[57] ABSTRACT

An output buffer circuit reduces switching induced noise in integrated circuit devices. A pulldown feed forward circuit is coupled between the input and the output pulldown transistor. The pulldown feed forward circuit bypasses at least some of the intermediate circuit elements of the output buffer circuit. The pulldown feed forward circuit initiates a relatively small sinking current through the output pulldown transistor in response to a first signal at the input before the intermediate circuit elements initiate relatively large sinking current through the output pulldown transistor means. A pullup feed forward circuit is coupled between the input and the output pullup transistor means. The pullup feed forward circuit bypasses at least some of the intermediate circuit elements of the output buffer circuit. The pullup feed forward circuit initiates a relatively small sourcing current through the output pullup transistor means in response to a second signal at the input before the intermediate circuit elements initiate the relatively large sinking current through the output pullup transistor. The output pulldown may include a relatively large current carrying capacity primary pulldown transistor element and a relatively small current carrying capacity secondary pulldown transistor element. The primary pulldown predriver is coupled to drive the primary pulldown transistor element, and the secondary pulldown predriver is coupled to drive the secondary pulldown transistor element. A similar circuit arrangement is provided for output pullup.

24 Claims, 4 Drawing Sheets

OUTPUT BUFFER CIRCUIT WITH SIGNAL FEED FORWARD FOR REDUCING SWITCHING INDUCED NOISE

TECHNICAL FIELD

This invention relates to a new output buffer circuit for reducing switching induced noise in high speed digital integrated circuit devices without sacrificing signal propagation time. The invention reduces noise during high to low and low to high transitions at the loaded output of the device. The invention is particularly applicable for multiple output devices driving relatively large loads on a common bus. For example, the invention provides low noise output buffers for octal buffer line drivers.

BACKGROUND ART

The basic integrated circuit output buffer includes an input for receiving data signals of high and low potential, an output for delivering data signals propagated through the output buffer, and intermediate circuit elements which may include amplifier stages and predrivers. A signal at the input propagates through the data path defined by the intermediate circuit elements to the output with a characteristic propagation delay. A relatively large current carrying capacity primary pulldown transistor element is coupled at the output for sinking discharge current from the output to ground. A relatively large current carrying capacity primary pullup transistor element is coupled at the output for sourcing charging current to the output from a power supply.

In both MOS and bipolar integrated circuit output buffers and devices, the pulldown transistor element initiates a relatively large sinking current from the output to external ground for discharging the output load capacitance during transition from high to low potential at the output. The surge or acceleration of charge develops a voltage across the output ground lead inductance proportional to L di/dt resulting in a positive ground rise in potential or ground bounce in what should be a static low output. This output ground bounce may typically be in the order of 0.5 to 3.5 volts above the external ground 0 volts for circuits with high output drive switching between $V_{cc}$ and ground. Deceleration of the initial surge of sinking current charge develops another voltage across the output ground lead inductance causing a negative ground voltage undershoot of potential in the output lead of opposite polarity from the ground bounce. The absolute value of the output undershoot negative spike may be as great as or greater than the positive ground bounce spike.

Similarly in both MOS and bipolar output circuits, the pullup transistor element initiates a relatively large sourcing current from a power supply to the output for charging the output load capacitance during transition from low to high potential at the output. The initial surge or acceleration of sourcing current charge develops a voltage across the output power supply lead inductance proportional to L di/dt resulting in a drop in the output supply voltage at the static high output. This drop in the output power supply voltage is referred to as supply voltage droop or $V_{cc}$ droop. Power supply voltage droop may be as great as for example 0.5 to 3.5 volts below the external supply voltage in circuits with high output drive. Deceleration of the surge of sourcing current charge through the pullup transistor element develops another voltage across the output supply lead inductance causing a positive output supply voltage overshoot of potential in the output lead of opposite polarity from the $V_{cc}$ droop. The positive spike of the $V_{cc}$ overshoot above the external supply voltage may be as great as the absolute value of the negative spike of $V_{cc}$ droop in the output lead.

The disruptive effects of this noise on the output ground and supply leads include pulsing of noise on input and internal circuit ground and power supply lines; radio frequency radiation interference (RFI) and electromagnetic induction interference (EMI) noise which may interfere with a host system; local shifts in the reference voltages for high and low potential data signals causing false data signals; and cross-talk interference with other outputs on a common bus. For example, a low output on an octal buffer line driver common bus may experience a rise with ground bounce causing a false high signal. These problems associated with output ground and supply noise are of increased concern in recent integrated circuits switch higher currents at higher speeds.

The phrase "transistor element" is used herein to refer to integrated circuit transistors from different IC technologies including MOS transistors such as NMOS, PMOS and CMOS transistor elements, and bipolar transistors including, for example, NPN and PNP transistor elements in transistor-transistor logic (TTL) and emitter coupled logic (ECL) circuits. The transistor elements are generically characterized as having a primary current path with primary current path first and second terminal leads or electrodes, and a third control terminal lead or electrode for controlling the conducting state of the primary current path. In the case of an NMOS transistor element, for example, the primary current path first terminal lead is the drain lead, the second terminal lead is the source lead, and the third control terminal lead is the gate lead, etc. In the case of a bipolar NPN transistor element, the primary current path first terminal lead is the collector lead, the second terminal lead is the emitter lead, and the control terminal lead is the base lead, etc. In the case of PMOS and PNP transistor elements, the role of the first and second terminal leads are the inverse from that of the NMOS and NPN transistor elements respectively.

An earlier U.S. patent application Ser. No. 355,509, filed May 19, 1989, by the present inventor, describes an improvement upon the basic output buffer. A relatively small current carrying capacity secondary pulldown transistor element is coupled with its current path first and second terminal leads in parallel with the current path first and second terminal leads of the primary pulldown transistor element. A separate pulldown delay resistance element of selected value is operatively coupled in series between the control terminal leads of the secondary and primary pulldown transistor elements.

The secondary pulldown transistor element control terminal lead is coupled in the output buffer to receive a signal propagating through the output buffer after the characteristic propagation delay and before the primary pulldown transistor element control terminal lead. The secondary pulldown transistor element therefore initiates a relatively small discharge current from the output before turn on of the relatively large discharge current of the primary pulldown transistor element. The separate pulldown delay resistance element value is selected for turning on the primary pulldown transistor element a specified time constant delay after the secondary pulldown transistor element during transition from high to low potential at the output.

A feature of the arrangement set forth in U.S. Ser. No. 355,509 is that the early turn on of a small current carrying capacity secondary pulldown transistor element initiates pulldown at the output and sinking of current from the output at only a small current sinking level. The initial sinking current level and the charge acceleration are constrained by the size and internal resistance of the small current carrying capacity transistor element. As a result the positive ground rise of potential proportional to L di/dt is also constrained to a lower level, typically less than one half that of a conventional output buffer. Subsequent ground undershoot is similarly less. It is noted that the small sinking current is initiated only after the full propagation delay of an input signal propagating through the data path of the intermediate circuit elements to the output of the buffer circuit.

The separate pulldown delay resistance element and the parasitic capacitance of the primary pulldown transistor element form an RC delay network which delays turn on of the primary or large current carrying capacity pulldown transistor element. This delay is determined by the selected resistance value of the pulldown delay resistance element and consequent time constant of the RC delay network. An advantage of this arrangement is that the small secondary sinking current continues to discharge the charge stored in the output load capacitance during the time constant delay. Upon turn on of the primary large current carrying capacity pulldown transistor element a second positive ground rise of potential occurs. However, the second ground bounce is now also limited by the reduction in charge in the output load capacitance already effected by the early small secondary sinking current. The reduced sinking current level and charge level also constrains and limits subsequent ground undershoot.

According to U.S. Ser. No. 355,509, the ratio of current carrying capacities of the primary and secondary pulldown transistor elements and the value of the pulldown delay resistance element are selected to achieve the following objective. The first positive ground rise in potential (first ground bounce) caused by early turn on of the secondary pulldown transistor element, and the second positive ground rise in potential (second ground bounce) caused by later turn on of the primary pulldown transistor element are arranged to be substantially equal by the selection of parameter values. The prior application provides a new method and new IC structure for minimizing the positive ground bounce spike by dividing or bifurcating the ground bounce spike into two components. The two component spikes are equalized by adjusting the values of mask programmable separate components at the output. As a result, the two phase, two step or bifurcated turn on component ground spikes may be limited to a noise level typically less than half that of conventional output buffers.

In the circuit of U.S. Ser. No. 355,509 the ratio of current carrying capacities of the primary to secondary pulldown transistor elements is at least approximately 4 to 1 with a discrete delay resistor having a value of for example 5K ohms to equalize and minimize the component first and second ground bounce spikes. Typically the ratio of current carrying capacities of the primary to secondary pulldown transistor elements is in the range of approximately 4/1 to 7/1. In the case of MOS transistor elements this is accomplished by setting the ratio of the channel widths of the primary to secondary pulldown transistor elements at approximately at least 4 to 1, and in the range of 4/1 to 7/1 etc.

In order to accelerate turn off of the primary pulldown transistor element during the reverse transition from low to high potential at the output, the circuit of U.S. Ser. No. 355,509 provides a pulldown delay bypass transistor element having its current path first and second terminal leads coupled between the control terminal lead of the primary pulldown transistor element and ground. A pulldown delay bypass control circuit operatively couples the control terminal lead of the bypass transistor element to the control terminal lead of the secondary pulldown transistor element. This permits bypassing the pulldown delay resistance element for rapid turn off of the primary pulldown transistor element during transition from low to high potential at the output. Typically the bypass control circuit incorporates an inverting element for applying the proper polarity signal to the control terminal lead of the bypass transistor element.

U.S. Ser. No. 355,509 describes similar measures for reducing noise on the supply rail side of the output buffer. A relatively small current carrying capacity secondary pullup transistor element is coupled with its primary current path first and second terminal leads in parallel with the current path first and second terminal leads of the primary pullup transistor element. A separate pullup delay resistor element of selected resistance value is coupled in series between the control terminal leads of the secondary and primary pullup transistor elements.

The secondary pullup transistor element control terminal lead is coupled in the output buffer to receive a signal propagating through the output buffer after the characteristic propagation delay, but before the primary pullup transistor element control terminal lead. The secondary pullup transistor element initiates a relatively small charging current from a power supply to the output before turn on of the relatively large charging current of the primary pullup transistor element during transition from low to high potential at the output. The discrete delay pullup resistor element resistance value is selected for turning on the primary pullup transistor element a specified time constant delay after the secondary pullup transistor element.

The ratio of the current carrying capacities of the primary and secondary pullup transistor elements and the value of the pullup delay resistance element are selected to achieve the similar objective of bifurcating both the power droop and subsequent overshoot. The first negative power droop in potential (first $V_{cc}$ droop) caused by turn on of the secondary pullup transistor element, and the second negative power droop in potential (second $V_{cc}$ droop) caused by later turn on of the primary pulldown transistor element are arranged to be substantially equal by the selection of parameter values. To this end the ratio of current carrying capacities of the primary to secondary pullup transistor elements is at least approximately 4 to 1 and preferably in the range of 4/1 to 7/1, with a separate delay resistor element having a value of for example one thousand ohms (1K ohms). For rapid turn off of the pullup transistor element during the transition from high to low potential at the output, a pullup delay bypass transistor element and pullup delay bypass control circuit bypass the pullup delay resistor element.

In a typical output buffer line driver the characteristic propagation delay of a signal from the input to the output is, for example, 4 ns, operating into a standard load capacitance of, for example, 50 pf. Using the circuit of U.S. Ser. No. 355,509, the ground bounce or rising ground voltage may be constrained to one half the conventional value without substantial additional increase in switching speed propagation delay. Such circuits are referred to herein as bifurcated turn on (BTO) output buffer circuits.

Objects of the Invention

It is an object of the present invention to provide improved circuit arrangements for implementing the concept of two phase, two step, or bifurcated turn on of sinking and sourcing currents in output buffer circuits for reducing switching induced noise. The new circuit arrangements similarly divide and reduce the peaks of ground bounce and undershoot and $V_{cc}$ droop and overshoot events by preceding the relatively large primary sinking and sourcing currents with early small secondary sinking and sourcing currents.

Another object of the invention is to increase switching speed of bifurcated turn on output buffer circuits and line drivers by initiating the early small secondary sinking and sourcing current before the standard signal propagation delay through the output buffer data path has elapsed. The relatively large primary sinking and sourcing currents are then initiated without further delay upon completion of the propagation time for an input signal propagating to the output.

A further object of the invention is to bifurcate and phase the turn on of the output pulldown and pullup transistor elements of an output buffer circuit by feeding forward a signal from the input to the output pulldown and pullup transistor elements and bypassing intermediate circuit elements to initiate an early small secondary sinking or sourcing current. The small sinking and sourcing currents are thereby initiated before the standard propagation time through the output buffer circuit has elapsed.

Yet another object of the invention is to implement bifurcated turn on output buffer circuits without the use of RC delay networks so that the primary sinking and sourcing currents are initiated promptly at the end of the standard propagation delay without any further time constant delay.

Disclosure of the Invention

In order to accomplish these results the invention provides a pulldown feed forward circuit operatively coupled between the input and an output pulldown transistor element bypassing at least some of the data path intermediate circuit elements. The pulldown feed forward circuit is constructed and arranged to initiate a relatively small sinking current through an output pulldown transistor element in response to a first signal at the input before the intermediate circuit elements initiate the relatively large sinking current through an output pulldown transistor element.

Similarly the invention provides a pullup feed forward circuit coupled between the input and an output pullup transistor element bypassing at least some of the data path intermediate circuit elements of the output buffer circuit. The pullup feed forward circuit is also constructed and arranged to initiate a relatively small sourcing current through an output pullup transistor element in response to a second signal at the input before the intermediate circuit elements initiate the relatively large sinking current through an output pullup transistor element.

The intermediate circuit elements of the output buffer circuit include a primary pulldown predriver having relatively large current carrying capacity transistor elements coupled to drive an output pulldown transistor element and initiate the relatively large sinking current. Generally at least one amplifier stage is coupled between the input and the primary pulldown predriver. The invention provides a pulldown feed forward circuit with a secondary pulldown predriver having relatively small current carrying capacity transistor elements. The secondary pulldown predriver is coupled to drive an output pulldown transistor element to initiate the relatively small sinking current before the primary pulldown predriver initiates the relatively large sinking current.

Similarly the intermediate circuit elements include a primary pullup predriver having relatively large current carrying capacity transistor elements coupled to drive an output pullup transistor element and initiate the relatively large sourcing current. Generally at least one amplifier stage is coupled between the input and the primary pullup predriver. The pullup feed forward circuit includes a secondary pullup predriver having relatively small current carrying capacity transistor elements. The secondary pullup predriver is coupled to drive an output pullup transistor element to initiate the relatively small sourcing current before the primary pullup predriver initiates the relatively large sourcing current.

According to one embodiment of the invention the output pullup circuit element consists of a single relatively large current carrying capacity output pullup transistor element. The output pulldown circuit element consists of a single relatively large current carrying capacity output pulldown transistor element. In the case of MOS circuit devices the pulldown transistor element is typically an NMOS transistor element while the pullup transistor element is typically a PMOS transistor element. In this example the primary and secondary pulldown predrivers are coupled in parallel to drive the single output pulldown transistor element. Similarly the primary and secondary pullup predrivers are coupled in parallel to drive the single output pullup transistor element.

The primary pulldown predriver includes both predriver pullup and pulldown transistor elements. Similarly the primary pullup predriver includes both predriver pullup and pulldown transistor elements. In the example of the invention using single output pulldown and pullup transistor elements, the secondary pulldown predriver may be implemented with at least one predriver pullup transistor element for turning on the output pulldown transistor element to initiate a small sinking current, without any predriver pulldown transistor elements. Similarly the secondary pullup predriver may be formed with at least one predriver pulldown transistor element for turning on the pullup transistor element to initiate a small sourcing current, without any predriver pullup transistor elements. The number of circuit components is therefore reduced according to this arrangement.

In the preferred embodiment of the invention the output pulldown circuit elements of the output buffer circuit include a relatively large current carrying capacity primary output pulldown transistor element and a relatively small current carrying capacity secondary output pulldown transistor element. The primary and secondary output pulldown transistor elements are coupled in parallel between the output and ground. The primary pulldown predriver in the output buffer circuit data path is operatively coupled to drive the primary output pulldown transistor element. The secondary pulldown predriver of the pulldown feed forward circuit is coupled to drive the secondary output pulldown transistor element.

Similarly in the preferred embodiment, the output pullup circuit elements include a relatively large current carrying capacity primary output pullup transistor element and a relatively small current carrying capacity secondary output pullup transistor element. The primary and secondary output pullup transistor elements are coupled in parallel between a power supply and the output. The primary pullup predriver of the output buffer circuit data path is coupled to drive the primary output pullup transistor element while the secondary pullup predriver of the pullup feed forward circuit is coupled to drive the secondary output pullup transistor element.

In either of the embodiments of the invention, the current carrying capacity of the relatively small current carrying capacity transistor elements of the secondary pulldown and pullup predrivers and secondary pulldown and pullup output transistor elements is preferably in the range of approximately 5-10 times less than the current carrying capacity of the relatively large current carrying capacity transistor elements of the primary pulldown and pullup predrivers and primary pulldown and pullup output transistor elements. In the case of MOS IC devices the channel width of the relatively small current carrying capacity transistor elements is in the range of approximately 5 to 10 times smaller than the channel width of the relatively large current carrying capacity transistor elements.

A feature and advantage of the small current carrying capacity transistor elements is that the resulting small gate load of the secondary predrivers can be coupled to nodes near the input without significantly effecting or negatively impacting the "fanout" of successive internal stages of the output buffer circuit. Because the gates of the smaller transistor elements of the secondary predrivers are driven by nodes nearer the input, the secondary predrivers turn on earlier than do the primary predrivers. Feed forward signals on the pulldown or pullup feed forward circuits in response to signals at the input therefore cause the bifurcated or two phase turn on of sinking and sourcing currents at the output.

A further feature of the invention is that the early small sinking and sourcing currents and later large sinking and sourcing currents implemented by the bifurcated turn on are shifted forward or advanced in time. That is, the early small sinking and sourcing currents are initiated by the feed forward signals in the pulldown and pullup feed forward circuits before the propagation time of standard signals through the data path intermediate circuit elements of the output buffer has elapsed. Furthermore the large primary sinking and sourcing currents are initiated promptly within the normal propagation time and are completed sooner. This is because the discharging or charging of the output capacitance is already commenced by the small secondary sinking and sourcing currents when the large primary sinking and sourcing currents take over the discharging or charging task. Thus the bifurcated turn on output buffer circuit of the present invention advances the timing of the two phase turn on to fall entirely within the time span or limit of the normal propagation time thereby improving switching speed.

The bifurcated turn on effected by the present invention similarly implements the objective of dividing or bifurcating each of the ground bounce and undershoot and power supply droop and overshoot events into two peaks or spikes of substantially the same magnitude. As a result, switching induced noise is reduced to 50% of the conventional noise levels or less.

Other objects, features and advantages of the invention are apparent in the following specification and accompanying drawings.

DESCRIPTION OF PREFERRED EXAMPLE EMBODIMENTS AND BEST MODE OF THE INVENTION

Figure 1:
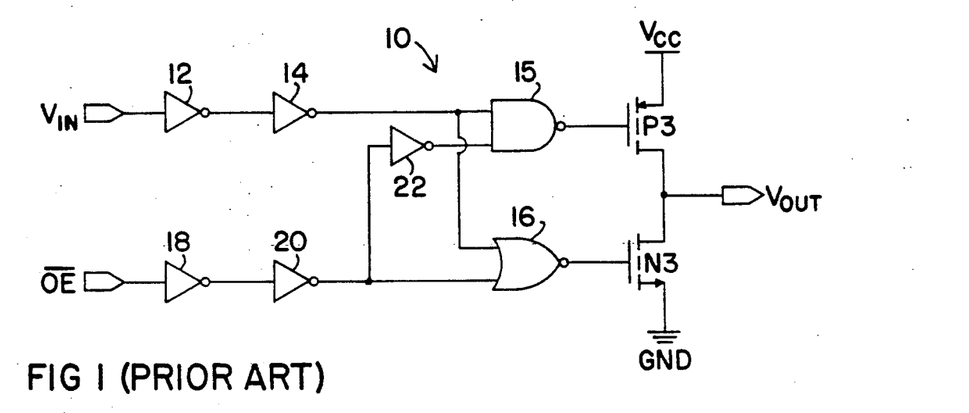
FIG. 1 is a schematic circuit diagram of a prior art MOS output buffer circuit.

A conventional prior art MOS transistor output buffer 10 is illustrated FIG. 1. Multiple output buffers of this type may be incorporated, for example, as output buffers in an octal buffer line driver. The pulldown transistor element is provided by the relatively large current carrying capacity NMOS transistor N3. The pullup transistor element is provided by relatively large current carrying capacity PMOS transistor element P3. Output buffer 10 is a non-inverting tristate output device, and data signals propagate from the input $V_{IN}$ to the output $V_{OUT}$. The tristate output enable and disable signals are applied at the OE terminal input.

A data signal at the input $V_{IN}$ passes through two inverting current amplification stages 12, 14 and then is applied at the same polarity as the input to the pullup predriver NAND gate 15 and the pulldown predriver NOR gate 16. NAND gate 15 drives pullup transistor element P3. NOR gate 16 drives the pulldown transistor element N3. The second input to each of the gates 15, 16 is derived from the OE terminal input.

An output enable signal OE is applied in inverted polarity $\overline{OE}$ at the tristate OE terminal. This tristate signal passes through first and second inverting current amplification stages 18, 20 and is applied at the same polarity as the OE signal to the input of predriver NOR gate 16. The tristate signal also passes through first and second inverting stages of current amplification 18, 20 and a third invertor stage 22 before it is applied to the input of NAND gate 15. The tristate signal applied to the input of predriver NAND gate 15 is thus of opposite polarity from the OE signal and is in phase with output enable signal OE.

The logic gate arrangement of the output buffer 10 of FIG. 1 delivers output data signals of high and low potential at the output $V_{OUT}$ in phase with data signals at the input $V_{IN}$ during bistate operation when the output enable signal OE is high (OE low). When the OE signal is low (OE high) during the high impedance third state, both the pullup transistor element P3 and the pulldown transistor element N3 are disabled. The output $V_{OUT}$ appears as a high impedance to other output buffers on a common bus.

Figure 2:
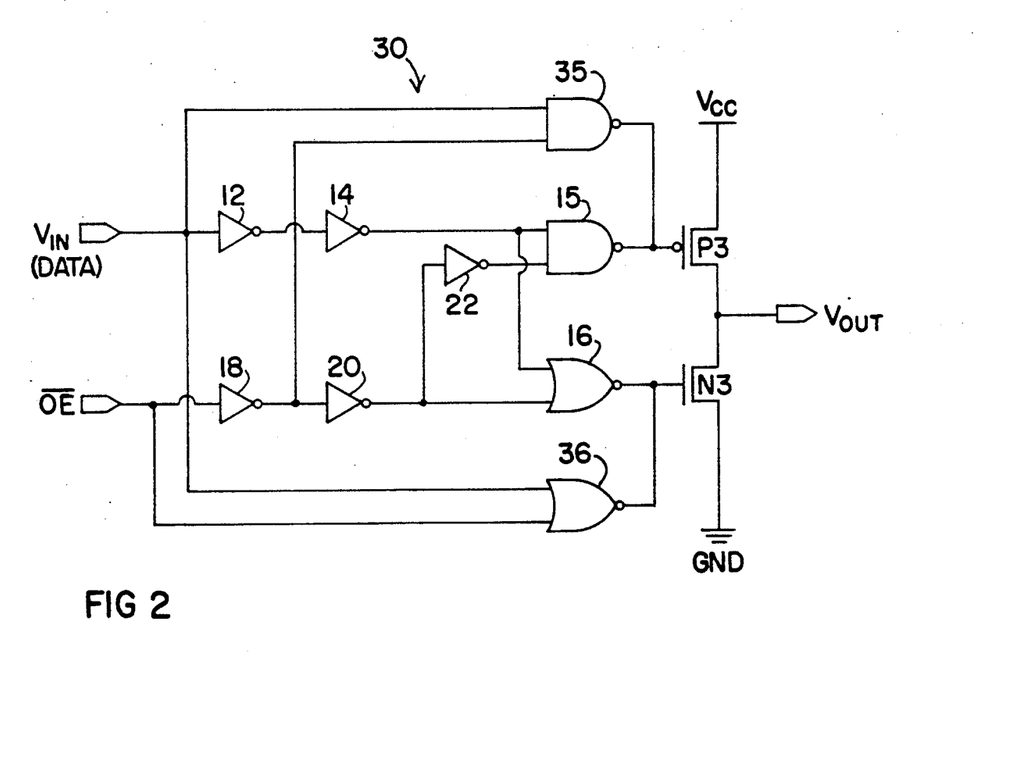
FIG. 2 is a schematic circuit diagram of an output buffer circuit with signal feed forward according to the invention for reducing switching induced noise.

An improved output buffer circuit 30 according to the invention is illustrated in FIG. 2. Integrated circuit elements and components performing the same function as in the output buffer circuit 10 of FIG. 1 are indicated by the same reference numerals or reference designations. Because FIG. 1 is reproduced from U.S. patent application Ser. No. 355,509 the MOS transistor symbols there used for PMOS transistor element P3 and NMOS transistor element N3 are incorporated in FIG. 1. In the circuits of the present invention illustrated in FIGS. 2-5, simplified symbols for the PMOS and NMOS transistor elements are used.

In addition to the circuit components and elements in common with FIG. 1, the improved output buffer circuit 30 of FIG. 2 includes a pullup feed forward circuit provided by secondary pullup predriver 35 and a pulldown feed forward circuit provided by pulldown predriver 36. In the circuit of FIG. 2 the secondary pullup predriver 35 is a NAND gate as is the primary pullup predriver 15. The secondary pulldown predriver 36 is a NOR gate as is the primary pulldown predriver 16.

The secondary pullup and pulldown predrivers 35 and 36 however differ from the respective primary pullup and pulldown predrivers 15 and 16 in that they are fabricated with relatively small MOS transistor elements characterized by relatively high resistance and relatively small current carrying capacity.

In the case of a conventional NMOS transistor element or N-channel enhancement type field effect transistor, spaced apart source and drain N-type regions are diffused or implanted in the surface of a P-type silicon substrate. An insulating layer such as an oxide layer is formed over the source and drain regions and separating channels. Conductive strips of, for example, polysilicon or metal are deposited over the channels separating the multiple source and drain regions, overlapping the respective source and drain regions to provide a gate. In such an N-channel enhancement type field effect transistor, a positive or high level signal on the gate causes a layer of N-type carriers to form in the P-channel separating the source and drain regions. The transistor element therefore becomes conducting through the primary current path between the source and drain regions.

In the case of conventional PMOS transistor elements or P-channel enhancement type field effect transistors, the source and drain regions are P-type regions diffused or implanted in an N-type silicon substrate. The separating channels are therefore formed of N-type silicon material. In the case of a PMOS transistor element a negative or low level signal applied to the gate causes a layer of P-type carriers to form in the separating N channel. As a result the PMOS transistor becomes conducting through its primary current path between the sources and drain D regions upon application of the negative or low level signal to the gate G1.

The current carrying capacity of MOS transistors is a function, among other things, of the channel resistance of the MOS transistors. The channel resistance in turn depends on the geometry of the channel. While the channel resistance can be reduced by decreasing the length of the distance across the channel between the source and drain regions, this distance typically is fixed. The channel resistance can be increased and decreased by increasing and decreasing the channel width of the interacting sides of the source and drain regions. Thus, current carrying capacity is proportional to channel width.

By way of example, the channel width of the four transistor elements in the standard NAND gate 15 forming the primary pullup predriver may be fabricated with a channel width of approximately 500u. The 500u channel width provides transistor elements of relatively large current carrying capacity. In contrast to this the channel width of the transistor elements in NAND gate 35 forming the secondary pullup predriver may be fabricated with a channel width of approximately for example 80u. Preferably the channel width of the small transistor element of the secondary predrivers is in the range of 5 to 10 times smaller than the channel width of the large transistor elements in the primary predrivers.

By way of another example, a signal feed forward output buffer circuit according to FIG. 2 was assembled with a primary pullup predriver NAND gate 15 of four relatively large transistor elements. NAND gate 15 consisted of two PMOS predriver pullup transistor elements with channel widths of 334u and two NMOS predriver pulldown transistor elements with channel widths of 298u. The secondary pullup predriver NAND gate 35 was assembled with four relatively small transistor elements consisting of two PMOS predriver pullup transistor elements with channel widths of 36u and two NMOS predriver pulldown transistor elements with channel widths of 30u.

The primary pulldown predriver NOR gate 16 was assembled with four relatively large transistor elements consisting of two PMOS predriver pullup transistor elements with channel widths of 334u and two NMOS predriver pulldown transistor elements with channel widths of 73u. The secondary pulldown predriver NOR gate 36 was constructed with four transistor elements consisting of two PMOS predriver pullup transistor elements with channel widths of 36u and two NMOS predriver pulldown transistor elements with channel widths of 9u.

For these predriver transistor element parameter dimensions, the PMOS output pullup transistor element P3 was selected with a channel width of 1600u and the NMOS output pulldown transistor element N3 was selected with a channel width of 800u. The larger dimension of PMOS transistor elements in comparison with NMOS transistor elements of the same pair in either a predriver or at the output is because of the lower mobility of holes (P type carriers) in comparison with electrons (N type carriers). All the predriver and output transistor elements have a common channel length of 1.05u so that channel resistance and current carrying capacity are proportional to channel width. Overall the relatively small current carrying capacity secondary predriver transistor elements were selected to be in the range of approximately 5-10 times smaller in channel width, channel resistance, and current carrying capacity than the corresponding relatively larger primary predriver transistor elements.

The sizes of all the transistor elements may be, for example, increased for greater power applications while maintaining the same relative relationship of channel width parameters. For bipolar circuits such as TTL and ECL circuits using for example NPN transistor elements, the ratio of current carrying capacities between corresponding secondary and primary predriver transistor elements is controlled by collector resistors and base resistors. The ratio of current carrying capacities is adjusted within the preferred range by selection of the base drive resistors and collector resistors.

By maintaining a ratio of current carrying capacities for corresponding primary to secondary predriver transistor elements of at least approximately 5 and preferably greater (that is selecting and arranging current carrying capacities of secondary predriver transistor elements to be at least 5 times less than the current carrying capacities of corresponding primary predriver transistor elements and preferably smaller in the range of 5 to 10 times less), the current demand and power demand of the signal feed forward circuit secondary predrivers is essentially minimal and negligible in comparison with the primary predrivers. As a result, the secondary predrivers may be coupled to a node closer to the input or directly at the input node as shown in FIG. 2, bypassing the data path amplifier stages and data path intermediate circuit elements of the output buffer circuit. The signal feed forward circuits are coupled between the input node and output pulldown and pullup transistor elements without substantially affecting or negatively impacting the "fanout" of intermediate amplifier stages of the output buffer circuit data path.

The propagation delay through the data path of the output buffer circuit including intermediate circuit element amplifier stages is typically 4ns. Bypassing at least one amplifier stage, the feed forward signal arrives at the output initiating the small secondary sinking or sourcing current, for example 1.5ns before the data path signal initiates the large primary sinking or sourcing current. Bypassing all of the intermediate circuit elements of the data path, the feed forward signal may arrive at the output and initiate the small secondary sinking or sourcing current for example 1.5ns to 3.0ns before the data path signal initiates the primary output capacitance discharging or charging current. This bifurcation of turn on of the output pulldown or pullup transistor elements into two steps with an early small discharging or charging current and a later large discharging or charging current also bifurcates the ground bounce or $V_{cc}$ power droop events and subsequent undershoot and overshoot events from one spike or peak into two spikes or peaks each at only one half or less of the conventional noise levels.

By selecting the transistor element parameters for the data path primary predrivers and the feed forward circuit secondary predrivers in the preferred range, the present invention achieves the objective for the bifurcated turn on (BTO) output buffer circuits. That objective is to equalize the first and second ground rise and the first and second $V_{cc}$ power droop events associated with the early small and later large sinking or sourcing currents at the output to reduce switching induced noise on the ground and power supply rails by substantially one half. This applies also to subsequent ground undershoot and power overshoot events on the ground and power supply rails.

Furthermore this bifurcated turn on is achieved without any prolongation of the data path propagation delay in the propagation of input signals to the output. This is accomplished by the signal feed forward circuits which initiate the early small discharging or charging currents before the normal data path propagation delay time has elapsed. The phase of the small sinking or sourcing current is advanced so that the entire two phase bifurcated turn on at the output is accomplished within the normal data path propagation delay time without prolonging the propagation delay and without negatively impacting the switching speed of the output buffer circuit.

In the circuit of FIG. 2, signal feed forward circuits are described for both the pulldown transistor element on the ground side and the pullup transistor element on the supply side respectively. It is apparent, according to the invention however that either secondary pulldown or pullup predriver may be provided on the respective ground side or supply side alone. Ground noise is typically of greater concern and an MOS output buffer circuit might typically be provided with the additional noise reduction signal feed forward circuit on the ground side alone.

Figure 3:
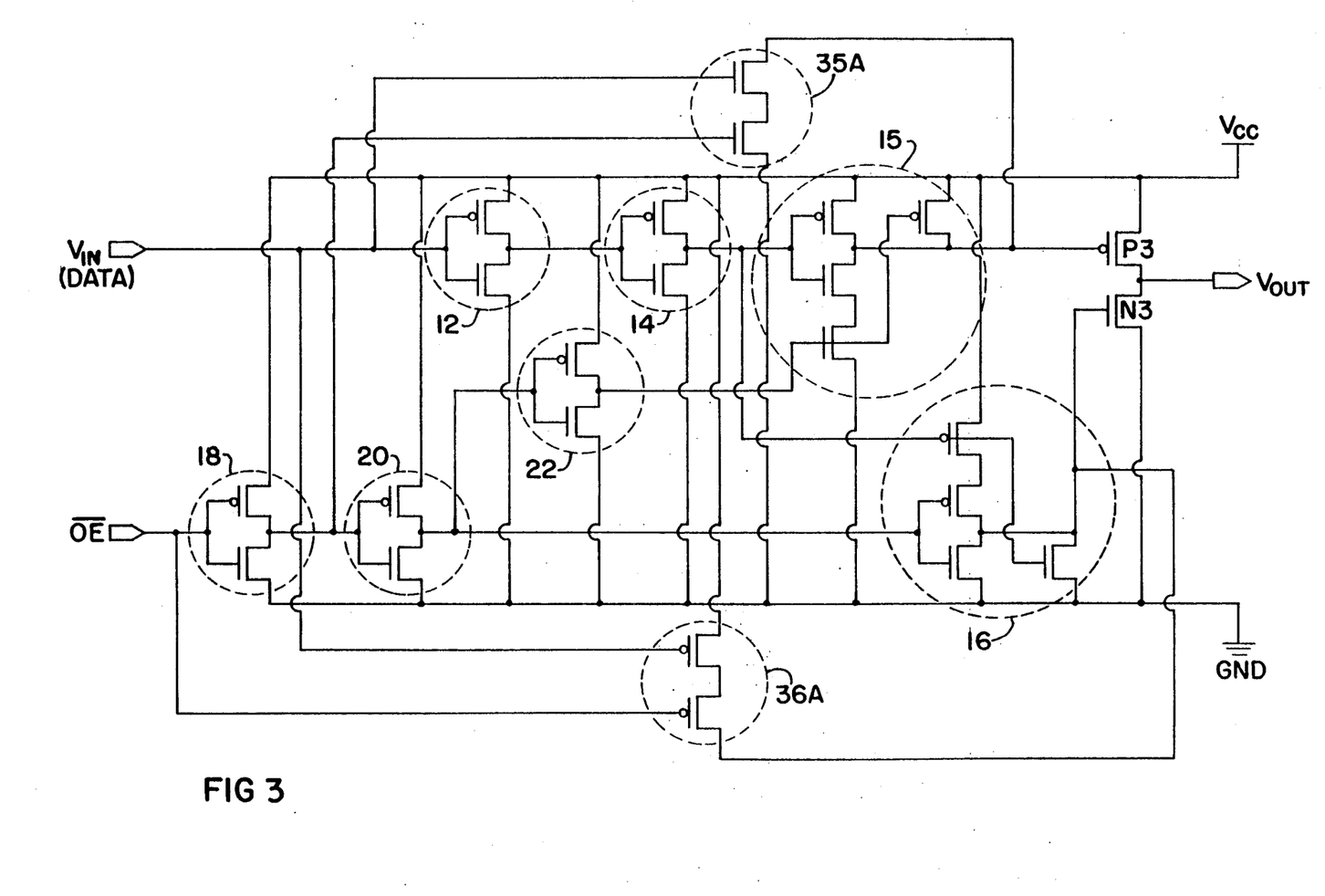
FIG. 3 is a detailed schematic circuit diagram showing components for implementation of a modification of the circuit of FIG. 2 with the secondary pulldown and pullup predrivers modified to reduce circuit components.

A detailed implementation of the circuit of FIG. 2 is illustrated in FIG. 3 with a slight modification of the secondary pullup and pulldown predrivers 35, 36 to reduce circuit components. As illustrated in FIG. 3 the primary data path from $V_{IN}$ through the amplifier stage inverters 12, 14 and primary pullup and pulldown predrivers 15, 16 to the output pullup and pulldown transistor elements P3,N3 and output $V_{OUT}$ remains the same. Similarly the output enable signal path from OE through inverting amplifier stages 18, 20, 22 to the primary pullup and pulldown predrivers 15, 16 also remains the same. The pullup and pulldown signal feed forward circuits provided by the secondary pullup predriver NAND gate 35 and secondary pulldown predriver NOR gate 36 of FIG. 2 are modified.

As shown in FIG. 3 the secondary pullup predriver 35A consists of a pair of NMOS predriver pulldown or current sinking transistor elements coupled between the data input $V_{IN}$ and the control gate of the output PMOS pullup transistor element P3. Predriver 35A therefore bypasses the intermediate circuit elements and the data signal propagation data path. The pair of NMOS transistor elements 35A provides a pair of predriver pulldown transistor elements for controlling and initiating early turn on of a relatively small charging current through the output PMOS pullup transistor element P3 from $V_{cc}$ to the output $V_{OUT}$. The predriver PMOS pullup or current sourcing transistor elements of predriver NAND gate 35 are eliminated to reduce components.

The reason that the secondary pullup predriver current sourcing transistor elements can be eliminated in the secondary pullup predriver 35A is that noise reduction on the pullup side of the output buffer circuit is relevant only to the turn on of the output pullup transistor element P3 during transition from low to high potential at the output. This control is provided by the pair of NMOS predriver current sinking transistor elements of the secondary pullup predriver 35A. The function of turning off the output pullup transistor element N3 is therefore left to the relatively larger current carrying capacity PMOS transistor elements of the primary pullup predriver 15.

The current carrying capacity of each of the NMOS transistor elements of secondary pullup predriver 35A is 5 to 10 times smaller than the current carrying capacity of the corresponding transistor elements of the primary pullup predriver 15 as heretofore described. The secondary pullup predriver 35A therefore initiates an early relatively small sourcing current through the pullup transistor P3 upon initiation of a first data signal at the input $V_{IN}$. This occurs before the data signal propagates through the signal propagation data path to the output pullup and pulldown transistor elements P3 & N3. The noise spike from either $V_{cc}$ droop or overshoot can therefore be reduced in amplitude by 50% to small noise peaks as heretofore described.

As also shown in FIG. 3, the secondary pulldown predriver 36A consists of a pair of predriver PMOS pullup or current sourcing transistor elements coupled between the input and the control gate of the output NMOS pulldown transistor element N3. The pair of PMOS predriver pullup transistor elements of pulldown predriver 36A control and initiate turn on of a relatively small discharge current through the output pulldown transistor element N3 from the output $V_{OUT}$ to ground GND. The predriver NMOS pulldown or current sinking transistor elements of secondary predriver NOR gate 36 of FIG. 2 have been eliminated because the relevant switching noise on the pulldown side of the output buffer circuit occurs upon turn on of the output pulldown transistor element N3 during transition from high to low potential at the output. NMOS predriver pulldown transistor elements can therefore be eliminated from secondary pulldown predriver 36A. The function of turning off the output pulldown transistor element N3 is therefore left to the relatively larger current carrying capacity NMOS pulldown transistor elements of the primary pulldown predriver 16.

The current carrying capacity of each of the predriver PMOS pullup transistor elements of secondary pulldown predriver 36A is selected to be 5 to 10 times smaller than the current carrying capacity of the PMOS predriver pullup transistor elements of the primary predriver NOR gate 16. As a result the secondary pulldown predriver 36A initiates the small early sinking current through pulldown transistor element N3 in response to a second data signal at the input $V_{IN}$ before the data signal propagates through the data path of the intermediate circuit elements to the output pullup and pulldown transistor elements P3,N3. As a result the objective of the invention can be achieved, of reducing the amplitude of the noise spike of either ground bounce or ground undershoot by 50% to a pair of smaller noise peaks.

In the output buffer circuits with signal feed forward illustrated in FIGS. 2 & 3, simultaneous conduction of the relatively large current capacity output pullup and pulldown transistor elements P3, N3 may occur during switching at the output. For example, the early relatively small secondary sourcing current that is initiated through the PMOS output pullup transistor element P3 may occur while the relatively large primary sinking current is still discharging through the output pulldown transistor element N3. Similarly the relatively small secondary sinking current initiated through output pulldown transistor element N3 may occur at the same time that the relatively large primary sourcing current is still charging through the output pullup transistor element P3. The result can be increased power consumption during switching transitions at the output, electromagnetic interference, and rising ground potential. The rising ground potential may reduce the noise margin and cause uncontrolled switching or "glitches" at the output.

Figure 4:
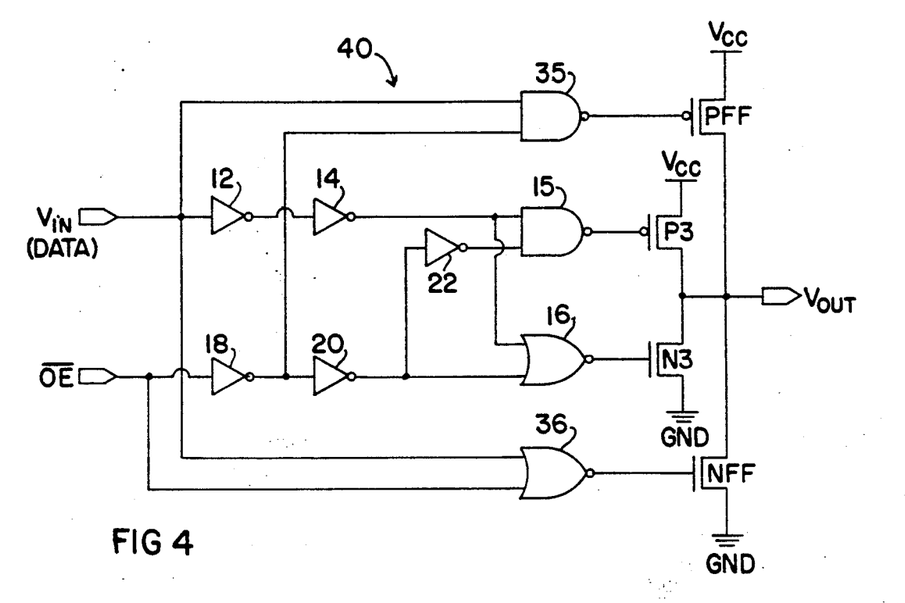
FIG. 4 is a schematic circuit diagram of the preferred signal feed forward output buffer circuit for reducing switching induced noise.
Figure 5:
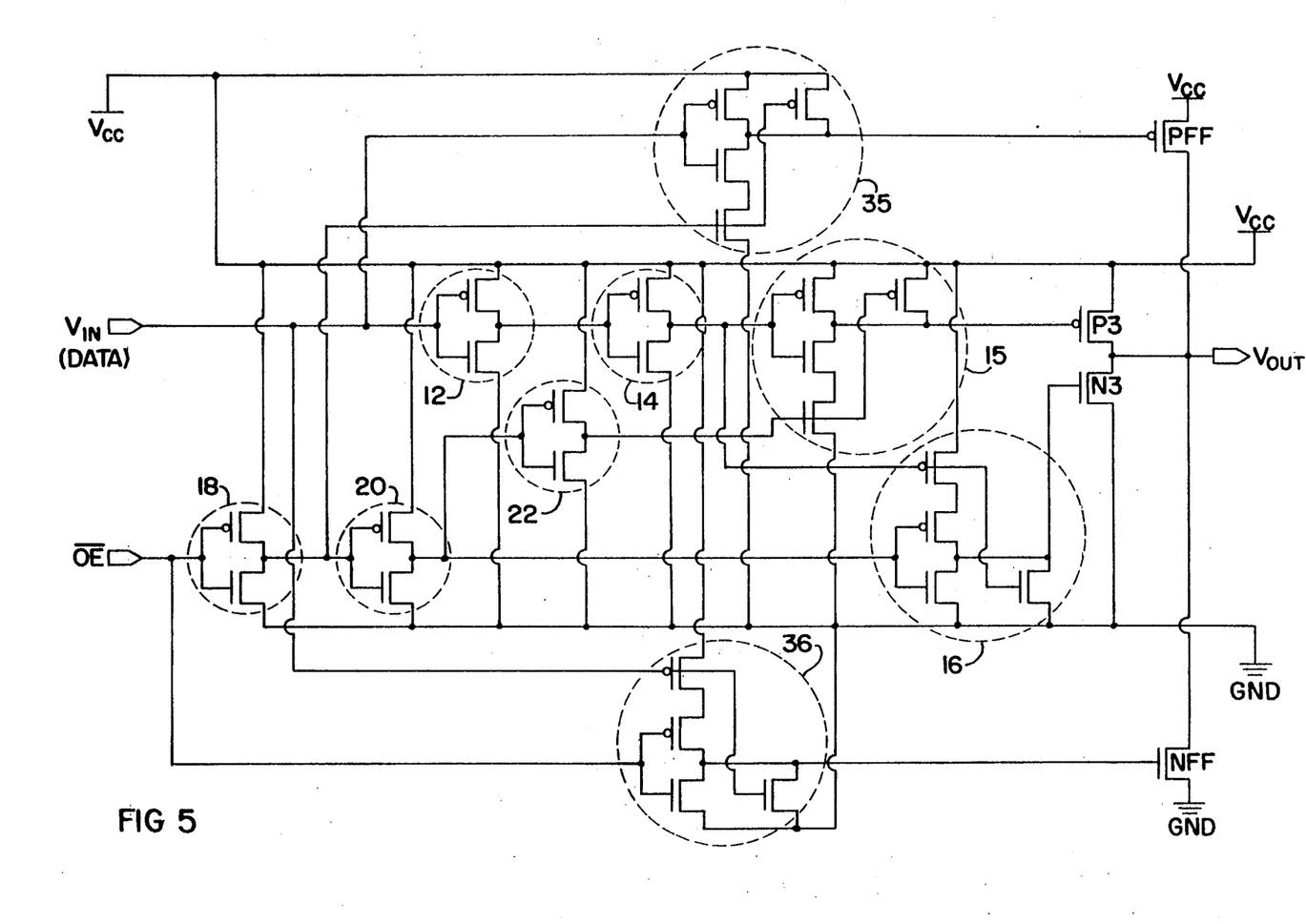
FIG. 5 is a detailed schematic circuit diagram showing the components for implementation of the circuit of FIG. 4.

To avoid these problems of simultaneous conduction of the relatively large current carrying capacity output pullup and pulldown transistor elements P3,N3 a preferred circuit embodiment of the output buffer circuit is illustrated in FIGS. 4 & 5. The difference between the preferred signal feed forward circuit of FIG. 4 and the signal feed forward output buffer circuit of FIG. 2 is that secondary output pullup and pulldown transistor elements PFF, NFF have been added. The secondary or feed forward pullup transistor element PFF is a relatively small current carrying capacity PMOS transistor element coupled in parallel with the primary pullup transistor element P3 between the power supply $V_{CC}$ and output $V_{OUT}$. The secondary or feed forward pulldown transistor element NFF is a relatively small current carrying capacity NMOS transistor element coupled in parallel with the primary pulldown transistor element N3 between the output $V_{OUT}$ and ground GND. The current carrying capacity of the secondary transistor elements PFF, NFF is selected to be in the preferred range of 5-10 times smaller than that of the primary transistor elements P3, N3.

The secondary pullup predriver NAND gate 35 is now coupled to drive only the secondary feed forward pullup transistor element PFF. The primary pullup predriver 15 is coupled to drive only the primary pullup transistor element P3. Similarly the secondary or feed forward pulldown predriver NOR gate 36 is coupled to drive only the secondary feed forward pulldown transistor element NFF. The primary pulldown predriver NOR gate 16 is coupled to drive only the primary output pulldown transistor element N3.

In the preferred embodiment the invention therefore provides a parallel feed forward circuit consisting of the secondary pullup predriver 35 and secondary output pullup transistor element PFF coupled in parallel with the primary data path through the primary pullup predriver 15 and primary output pullup transistor element P3. Similarly the pulldown feed forward circuit consisting of secondary pulldown predriver 36 and secondary output pulldown transistor element NFF is coupled in parallel with the primary data path through the primary pulldown predriver NOR gate 16 and primary pulldown transistor element N3. By this arrangement simultaneous conduction by the relatively large current carrying capacity primary output pullup and pulldown transistor elements P3, N3 as described with reference to the circuit embodiments of FIGS. 2 & 3 is avoided. Simultaneous conduction may only occur by a relatively small current carrying capacity secondary transistor element with a relatively large current carrying capacity primary transistor element, thereby restricting and constraining simultaneous conduction and associated power dissipation, electromagnetic interference or glitches.

A detailed implementation of the circuit of FIG. 4 is illustrated in FIG. 5. The corresponding intermediate circuit elements including the inverting amplifier stages 12, 14, 18, 20, and 22, the primary pullup and pulldown predrivers NAND gate 15 and NOR gate 16, the secondary pullup and pulldown predrivers NAND gate 35 and NOR gate 36, the primary output pullup and pulldown transistor elements P3, N3, and the secondary output pullup and pulldown transistor elements PFF, NFF are indicated by the same reference numerals and reference designations. The preferred ratio of current carrying capacities between transistor elements of the corresponding primary to secondary output transistor elements remains in the same preferred range of 5 to 10 times greater. As a result the amplitude of noise spikes is substantially attenuated to 50% that of conventional levels as heretofore described.

Figure 6:
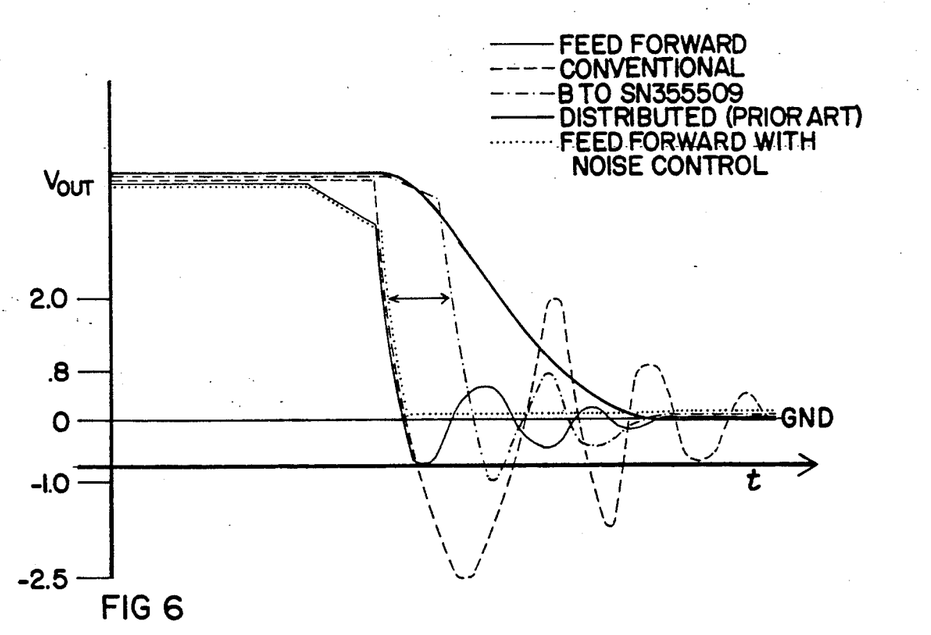
FIG. 6 is a graph comparing the operating output voltage $V_{out}$ characteristics of various output buffer circuits including the present invention.

A comparison of the performance of the signal feed forward output buffer circuit of the present invention with prior art output buffer circuits and Applicant's earlier BTO output buffer circuit is illustrated in the graph of FIG. 6. The graph of FIG. 6 provides a comparison of respective voltage signals and output voltage characteristics at the output $V_{OUT}$ verses time for a transition from high to low potential at the output. The prior art distributed transistor element output buffer circuit represented by the dark continuous line avoids transient swings of voltage but only with a sacrifice of substantial delay in the signal propagation time and transition from high to low potential. Such a prior art distributed or serpentine output pulldown transistor element for use in an output buffer circuit is illustrated for example in FIGS. 2 & 3 of Applicant's earlier U.S. patent application Ser. No. 355,509 referenced above. The conventional prior art output buffer circuit without the delay line provided by such a distributed output transistor element may be subject to severe swings or spikes of ground bounce and undershoot and subsequent transient ringing as shown by the dash line of FIG. 6.

The bifurcated turn on output buffer circuit of Applicant's earlier U.S. patent application Ser. No. 355,509 delivers an output in which the noise spikes of ground bounce and ground undershoot are substantially attenuated by as much as 50% as shown by the dash dot line of FIG. 6. The reduction in noise amplitude is achieved by Applicant's previous BTO output buffer circuit with only a small sacrifice in switching delay indicated by the double ended arrow of FIG. 6. The signal feed forward output buffer circuit of the present invention illustrated in FIGS. 2-5 achieves the same substantial reduction in amplitude of noise peaks by approximately 50% without any sacrifice in data signal propagation through the output buffer circuit and switching speed. The output performance of the circuits of FIGS. 2-5 is illustrated by the continuous light line of FIG. 6.

A further improvement on the output voltage signal performance of the circuits of FIGS. 2-5 can be achieved by adding further noise suppression circuits or anti-noise circuits. Such anti-noise circuits are described in copending U.S. patent application Ser. No. 327,348 filed Mar. 22, 1989 for ANTI-NOISE CIRCUITS by Alan C. Rogers and assigned to the assignee of the present invention. With the addition of such anti-noise circuits, even the attenuated noise peaks may be substantially eliminated without any sacrifice in signal propagation time and switching speed as shown by the dotted line of FIG. 6.

While the invention has been described with reference to particular example embodiments it is intended to cover all variations and modifications within the scope of the following claims.

I claim:

1. An output buffer circuit for reducing switching induced noise in integrated circuit devices, said output buffer circuit having an input for receiving data signals of high and low potential, an output for delivering data signals propagated through the output buffer circuit after a specified data signal propagation delay, output pulldown transistor means operatively coupled at the output for sinking current from the output to ground, output pullup transistor means operatively coupled at the output for sourcing current to the output from a power supply, and output buffer circuit data signal propagation intermediate circuit elements operatively coupled between the input and the output pulldown and pullup transistor means to initiate relatively large sinking and sourcing currents through the respective output pulldown and pullup transistor means after said specified data signal propagation delay in response to data signals at the input, the improvement comprising:

pulldown feed forward circuit means operatively coupled between the input and the output pulldown transistor means to initiate a pulldown feed forward signal, said pulldown feed forward circuit means bypassing at least some of the intermediate circuit elements of the output buffer circuit so that the pulldown feed forward signal is advanced in time relative to the data signal propagating through the intermediate circuit elements of the output buffer circuit to reduce pulldown feed forward signal propagation delay, said pulldown feed forward circuit being constructed to initiate a relatively small sinking current through the output pulldown transistor means before the intermediate circuit elements initiate the relatively large sinking current through said output pulldown transistor means after said specified data signal propagation delay.

2. The output buffer circuit of claim 1 further comprising:

pullup feed forward circuit means operatively coupled between the input and the output pullup transistor means to initiate a pullup feed forward signal, said pullup feed forward circuit means bypassing at least some of the intermediate circuit elements of the output buffer circuit so that the pullup feed forward signals is advanced in time relative to the data signal propagating through the intermediate circuit elements of the output buffer circuit to reduce pullup feed forward signal propagation delay, said pullup feed forward circuit means being constructed to initiate a relatively small sourcing current through the output pullup transistor means before the intermediate circuit elements initiate the relatively large sinking current through said output pullup transistor means after the specified data signal propagation delay.

3. The output buffer circuit of claim 2 wherein the intermediate circuit elements comprise a primary pullup predriver comprising relatively large current carrying capacity transistor elements operatively coupled to drive the output pullup transistor means and initiate the relatively large sourcing current, and at least one amplifier stage coupled between the input and the primary pullup predriver, and wherein the pullup feed forward circuit means comprises a secondary pullup predriver having relatively small current carrying capacity transistor elements operatively coupled to drive the output pullup transistor means to initiate the relatively small sourcing current through the output pullup transistor means, said pullup feed forward circuit bypassing at least one amplifier stage of the intermediate circuit elements to initiate the relatively small sourcing current before the primary pullup predriver initiates the relatively large sourcing current through said output pullup transistor means after said specified data signal propagation delay.

4. The output buffer circuit of claim 3 wherein the output pullup transistor means comprises a single relatively large current carrying capacity output pullup transistor element.

5. The output buffer circuit of claim 3 wherein the output pullup transistor means comprises a relatively large current carrying capacity primary pullup transistor element and a relatively small current carrying capacity secondary pullup transistor element, said primary and secondary pullup transistor elements being coupled in parallel between a power supply and the output, wherein the primary pullup predriver is operatively coupled to drive the primary pullup transistor element and wherein the secondary pullup predriver is operatively coupled to drive the secondary pullup transistor element.

6. The output buffer circuit of claim 5 wherein the transistor elements comprise MOS transistor elements and wherein the channel width of the relatively small current carrying capacity transistor elements is in the range of approximately 5-10 times smaller than the relatively large current carrying capacity transistor elements.

7. The output buffer circuit of claim 1 wherein the intermediate circuit elements comprise a primary pulldown predriver comprising relatively large current carrying capacity transistor elements operatively coupled to drive the output pulldown transistor means and initiate the relatively large sinking current and at least one amplifier stage coupled between the input and the primary pulldown predriver, and wherein the pulldown feed forward circuit means comprises a secondary pulldown predriver having relatively small current carrying capacity transistor elements operatively coupled to drive the output pulldown transistor means to initiate the relatively small sinking current through the output pulldown transistor means, said pulldown feed forward circuit bypassing at least one amplifier stage of the intermediate circuit elements to initiate the relatively small sinking current before the primary pulldown predriver initiates the relatively large sinking current through said output pulldown transistor means after the specified data signal propagation delay.

8. The output buffer circuit of claim 7 wherein the output pulldown transistor means comprises a single relatively large current carrying capacity output pulldown transistor element.

9. The output buffer circuit of claim 7 wherein the output pulldown transistor means comprises a relatively large current carrying capacity primary pulldown transistor element and a relatively small current carrying capacity secondary pulldown transistor element, said primary and secondary pulldown transistor elements being coupled in parallel between the output and ground, wherein the primary pulldown predriver is operatively coupled to drive the primary pulldown transistor element, and wherein the secondary pulldown predriver is operatively coupled to drive the secondary pulldown transistor element.

10. The output buffer circuit of claim 9 wherein the current carrying capacity of the relatively small current carrying capacity transistor elements is in the range of approximately 5-10 times less than the current carrying capacity of the relatively large current carrying capacity transistor elements.

11. The output buffer circuit of claim 10 wherein the transistor elements comprise MOS transistor elements and wherein the channel width of the relatively small current carrying capacity transistor elements is in the range of approximately 5-10 times smaller than the relatively large current carrying capacity transistor elements.

12. An output buffer circuit for reducing switching induced noise in integrated circuit devices, said output buffer circuit having an input for receiving data signals of high and low potential, an output for delivering data signals propagated through the output buffer circuit after a specified data signal propagation delay, output pulldown transistor means operatively coupled at the output for sinking current from the output to ground, output pullup transistor means operatively coupled at the output for sourcing current to the output from a power supply, the improvement comprising:

a primary pulldown predriver comprising relatively large current carrying capacity transistor elements coupled to drive the pulldown transistor means and initiate a relatively large sinking current after the specified data signal propagation delay in response to a first data signal at the input, a primary pullup predriver comprising relatively large current carrying capacity transistor elements coupled to drive the pullup transistor means and initiate a relatively large sourcing current after the specified data signal propagation delay in response to a second data signal at the input;

at least one amplifier stage coupled between the input and said primary pullup predriver, and at least one amplifier stage coupled between the input and said primary pulldown predriver;

a secondary pulldown predriver comprising relatively small current carrying capacity transistor elements, said secondary pulldown predriver being operatively coupled to the pulldown transistor means in parallel with the primary pulldown predriver;

said secondary pulldown predriver being coupled in the output buffer circuit between the input and said pulldown transistor means bypassing at least one of said amplifier stages of the output buffer circuit to drive the output pulldown transistor means and initiate a relatively small sinking current form the output in response to said first data signal at the input before the primary pulldown predriver initiates a large sinking current after said specified data signal data signal propagation delay.

13. The output buffer circuit of claim 12 further comprising:

a secondary pullup predriver comprising relatively small current carrying capacity transistor elements said secondary pullup predriver being operatively coupled to the pullup transistor means in parallel with the primary pullup predriver;

said secondary pullup predriver being coupled in the output buffer circuit between the input and pullup transistor means bypassing at least one of said amplifier stages of the output buffer circuit to drive the output pullup transistor means and initiate a relatively small sourcing current in response to said second data signal at the input before the primary pullup predriver initiates a large sourcing current after said specified data signal propagation delay.

14. The output buffer circuit of claim 13 wherein the output pulldown transistor means comprises a single relatively large current carrying capacity output pulldown transistor element coupled to the output and wherein the output pullup transistor means comprises a single relatively large current carrying capacity pullup transistor element coupled to the output.

15. The output buffer circuit of claim 14 wherein the primary pulldown predriver comprises predriver pullup and predriver pulldown transistor elements and wherein the secondary pulldown predrier comprises at least one predriver pullup transistor element without any predriver pulldown transistor elements.

16. The output buffer circuit of claim 15 wherein the primary pullup. predriver comprises predriver pullup and predriver pulldown transistor elements and wherein the secondary pullup predriver comprises at least one predriver pulldown transistor element without any predriver pullup transistor elements.

17. The output buffer circuit of claim 14 wherein the pulldown transistor means comprises a relatively large current carrying capacity NMOS pulldown transistor element (N3) and the pullup transistor means comprises a relatively large current carrying capacity PMOS pullup transistor element (P3).

18. The output buffer circuit of claim 17 wherein the primary pulldown predriver comprises a PMOS predriver pullup transistor element and an NMOS predriver pulldown transistor element, and wherein the secondary pulldown predriver comprises a PMOS predriver pullup transistor element without a predriver pulldown transistor element.

19. The output buffer circuit of claim 18 wherein the primary pullup predriver comprises a PMOS predriver pullup transistor element and an NMOS predriver pulldown transistor element and wherein the secondary pullup predriver comprises an NMOS predriver pulldown transistor element without a predriver pullup transistor element.

20. The output buffer circuit of claim 13 wherein the current carrying capacity of the relatively small current carrying capacity transistor elements is in the range of 5-10 times less than the current carrying capacity relatively large current carrying capacity transistor elements.

21. The output buffer circuit of claim 13 wherein:
the output pulldown transistor means comprises a relatively large current carrying capacity primary pulldown transistor element and a relatively small current carrying capacity secondary pulldown transistor element;
said primary and secondary pulldown transistor elements being coupled in parallel between the output and ground;
the primary pulldown predriver is coupled to drive the primary pulldown transistor element;
the secondary pulldown predriver is coupled to drive the secondary pulldown transistor element;
the output pullup transistor means comprises a relatively large current carrying capacity primary pullup transistor element and a relatively small current carrying capacity secondary pullup transistor element, and primary and secondary pullup transistor elements being coupled in parallel between a power supply and the output;
the primary pullup predriver is coupled to drive the primary pullup transistor element; and
the secondary pullup predriver is coupled to drive the secondary pullup transistor element.

22. The output buffer circuit of claim 21 wherein the current carrying capacity of the relatively small current carrying capacity transistor elements is approximately 5-10 times less than the current carrying capacity relatively large current carrying capacity transistor elements.

23. The output buffer circuit of claim 22 wherein the transistor elements comprise MOS transistor elements and wherein the channel width of the relatively small current carrying capacity MOS transistor elements is in the range of approximately 5-10 times smaller than the channel width of the relatively large current carrying capacity MOS transistor elements.

24. The output buffer circuit of claim 12 wherein:
the output pulldown transistor means comprises a relatively large current carrying capacity primary pulldown transistor element and a relatively small current carrying capacity secondary pulldown transistor element;
said primary and secondary pulldown transistor elements being coupled in parallel between the output and ground;
the primary pulldown predriver is coupled to drive the primary pulldown transistor element; and
the secondary pulldown predriver is coupled to drive the secondary pulldown transistor element.

* * * * *